United States Patent
Huang et al.

(10) Patent No.: US 10,121,943 B2
(45) Date of Patent: Nov. 6, 2018

(54) LIGHT EMITTING PACKAGE BASE STRUCTURE

(71) Applicant: UNISTARS CORPORATION, Zhudong Township (TW)

(72) Inventors: Liang-Kuei Huang, Taipei (TW); Shang-Yi Wu, Hsinchu (TW)

(73) Assignee: UNISTARS CORPORATION, Hsinchu (TW)

( * ) Notice: Subject to any disclaimer, the term of this patent is extended or adjusted under 35 U.S.C. 154(b) by 0 days.

(21) Appl. No.: 15/619,524

(22) Filed: Jun. 11, 2017

(65) Prior Publication Data

US 2018/0212115 A1    Jul. 26, 2018

(30) Foreign Application Priority Data

Jan. 20, 2017   (TW) .............................. 106102015 A

(51) Int. Cl.
| | |
|---|---|
| H01L 33/48 | (2010.01) |
| H01L 33/52 | (2010.01) |
| H01L 33/56 | (2010.01) |
| H01L 33/54 | (2010.01) |
| H01L 33/58 | (2010.01) |
| H01L 33/60 | (2010.01) |
| H01L 33/62 | (2010.01) |

(52) U.S. Cl.
CPC ............. *H01L 33/56* (2013.01); *H01L 33/486* (2013.01); *H01L 33/54* (2013.01); *H01L 33/58* (2013.01); *H01L 33/60* (2013.01); *H01L 33/62* (2013.01); *H01L 2224/48091* (2013.01); *H01L 2224/48227* (2013.01)

(58) Field of Classification Search
CPC ....... H01L 33/56; H01L 33/486; H01L 33/54; H01L 33/58; H01L 33/60; H01L 33/62
See application file for complete search history.

(56) References Cited

U.S. PATENT DOCUMENTS

| | | | |
|---|---|---|---|
| 2007/0102722 A1* | 5/2007 | Ishizaka | H01L 33/641 257/99 |
| 2012/0280374 A1* | 11/2012 | Choi | H01L 21/50 257/659 |
| 2017/0112952 A1* | 4/2017 | Kato | A61L 2/10 |

* cited by examiner

*Primary Examiner* — Asok K Sarkar
*Assistant Examiner* — Dmitriy Yemelyanov
(74) *Attorney, Agent, or Firm* — Ding Yu Tan

(57) ABSTRACT

A light emitting package base structure includes a carrier, a light emitting chip, a light transmission unit and a dam. The carrier has a supporting surface and an outer surface surrounding the supporting surface. The light emitting chip is disposed on the supporting surface and electrically connected to the carrier. The light transmission unit is disposed on the carrier and has a through hole. The dam is disposed between the carrier and the light transmission unit, and a hermetic receiving space is formed between the dam, the light transmission unit and the carrier. The light emitting chip is located in the hermetic receiving space and the dam has a side surface away from the hermetic receiving space. A gap is formed between the side surface and the outer surface, and the through hole is corresponded to a location between the side surface and the outer surface.

9 Claims, 5 Drawing Sheets

LIGHT EMITTING PACKAGE BASE STRUCTURE

FIELD OF THE INVENTION

The present invention relates to a package base structure, and more particularly to a light emitting package base structure.

BACKGROUND OF THE INVENTION

Light-emitting elements are normally packaged as single dies and then are applied to various applications such as fields of display or illumination, in which the light-emitting diode package base structures are currently mainstream products. During fabrication of conventional light-emitting diode package base structures, adhesives such as low-volatility adhesives or UV-curable adhesives are used to perform bonding between different elements. However, adhesives in the package base structure are often severely degraded due to illumination properties of the light-emitting diodes. For example, due to the short wavelength and the high energy of the ultraviolet-light light emitting diode, adhesives in the ultraviolet-light light emitting diode package structure will be affected and severely degraded.

Accordingly, high-volatility adhesives are typically used in fabrications of the ultraviolet-light light emitting diode package structure to prevent severe degradation of the adhesives. However, volatile gases are easily generated during thermal curing of the high-volatility adhesives, so that problems such as penetrations of the volatile gases into the hermetic receiving space of the light emitting diode package base structure are always happened. Therefore, the above-mentioned problems become focuses to be improved.

SUMMARY OF THE INVENTION

The present invention provides a light emitting package base structure, comprising a carrier, a light emitting chip, a light transmission unit, and a dam. The carrier has a supporting surface and an outer surface surrounding the supporting surface. The light emitting chip is disposed on the supporting surface and electrically connected to the carrier. The light transmission unit is disposed on the carrier, having at least one through hole. The dam is disposed between the carrier and the light transmission unit, surrounding the light emitting chip. A hermetic receiving space is formed between the dam, the light transmission unit and the carrier, and the light emitting chip is located in the hermetic receiving space. The dam has a side surface away from the hermetic receiving space, and a gap is formed between the side surface and the outer surface. The at least one through hole is correspond to a location between the side surface and the outer surface.

In an embodiment of the present invention, the carrier described above comprises a substrate and a supporting dam. The substrate comprises the supporting surface. The supporting dam is disposed at the supporting surface of the substrate, surrounding the light emitting chip. The supporting dam comprises the outer surface and a connection surface abutting the outer surface. The connection surface faces the light transmission unit. The dam is disposed between the connection surface and the transmission unit.

In an embodiment of the present invention, the substrate described above comprises ceramic material such as aluminum nitride or aluminum oxide.

In an embodiment of the present invention, the supporting dam described above comprises reflective materials.

In an embodiment of the present invention, the carrier described above is integrally formed.

In an embodiment of the present invention, the transmission unit described above comprises a lens portion and a plane portion connected with each other, and the lens portion is corresponding to the light emitting chip, the plane portion surrounds the lens portion, and the at least one through hole is located in the plane portion.

In an embodiment of the present invention, the amount of the through hole is multiple, and the multiple through holes surrounds the lens portion.

In an embodiment of the present invention, the lens portion described above comprises a convex lens or a concave lens or flat lens.

In an embodiment of the present invention, the light emitting package base structure described above further comprises an adhesive, and the adhesive is disposed between the carrier, the light transmission unit, and the side surface of the dam, and the light transmission unit is adhered to the carrier through the adhesive.

In an embodiment of the present invention, the light emitting chip described above comprises a deep-ultraviolet light emitting diode.

In the light emitting package base structure of the present invention, the light transmission unit is provided with through holes and a dam is disposed between the light transmission unit and the carrier in the light emitting package base structure of the present disclosure. In such a structural design, volatile gases caused by thermal curing of the adhesive during fabrication of the light emitting package base structure will be blocked by the dam and will not flow into the hermetic receiving space, and the volatile gases will be exhausted by the through holes of the light transmission unit to ensure that the hermetic receiving space remain vacuum. Accordingly, the problems of volatilized gases flowing in to hermetic receiving space found in conventional light emitting package base structure can be effectively solved.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
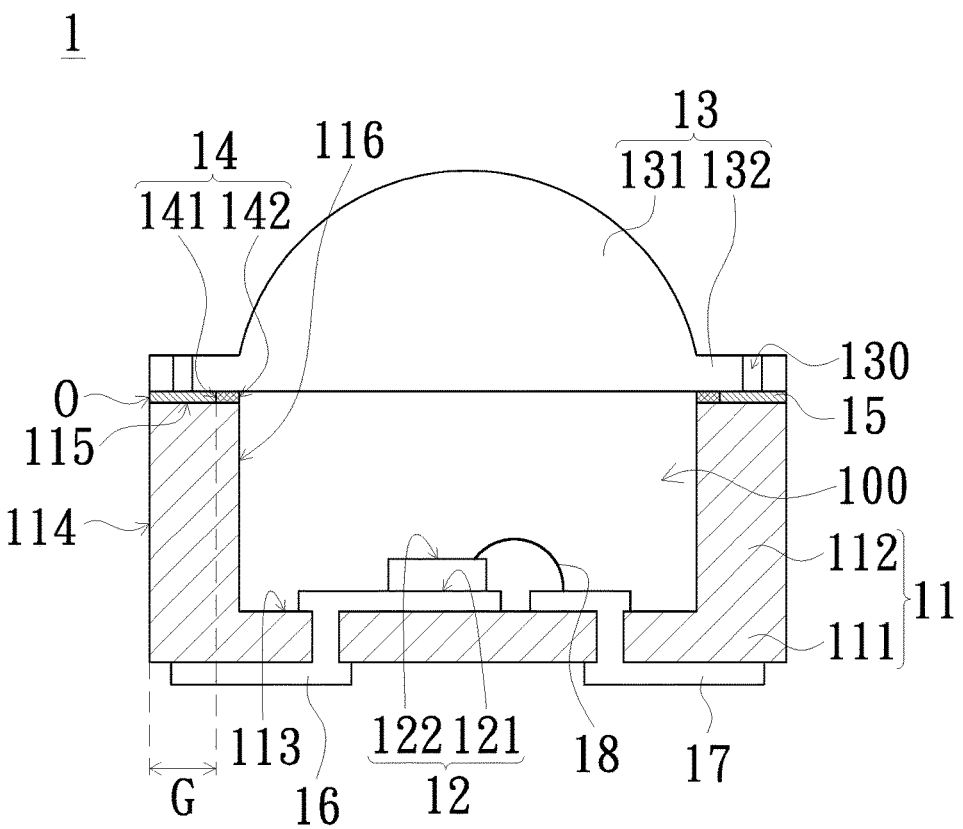
FIG. 1 is a schematic cross-sectional diagram of a light emitting package base structure in accordance with an embodiment of the present invention.
Figure 2:
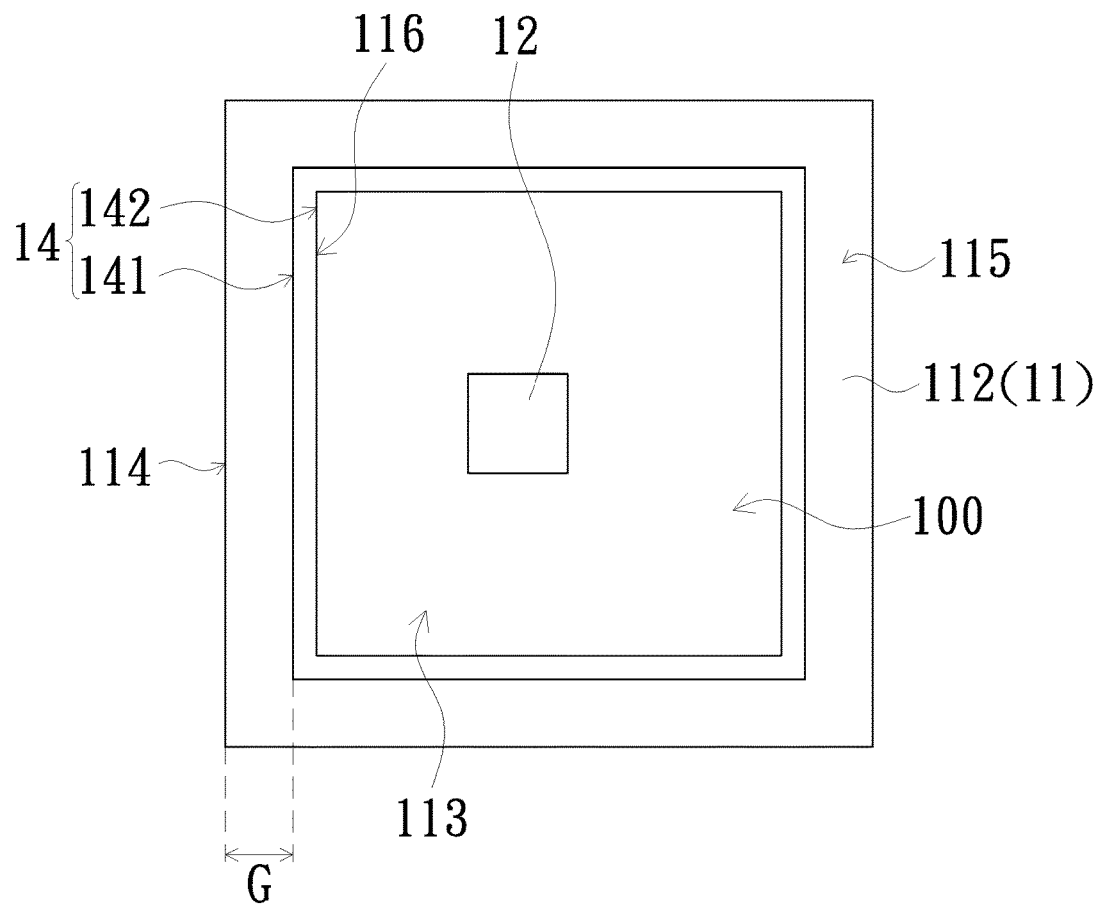
FIG. 2 is a schematic top view of a carrier and a dam shown in FIG. 1.
Figure 3:
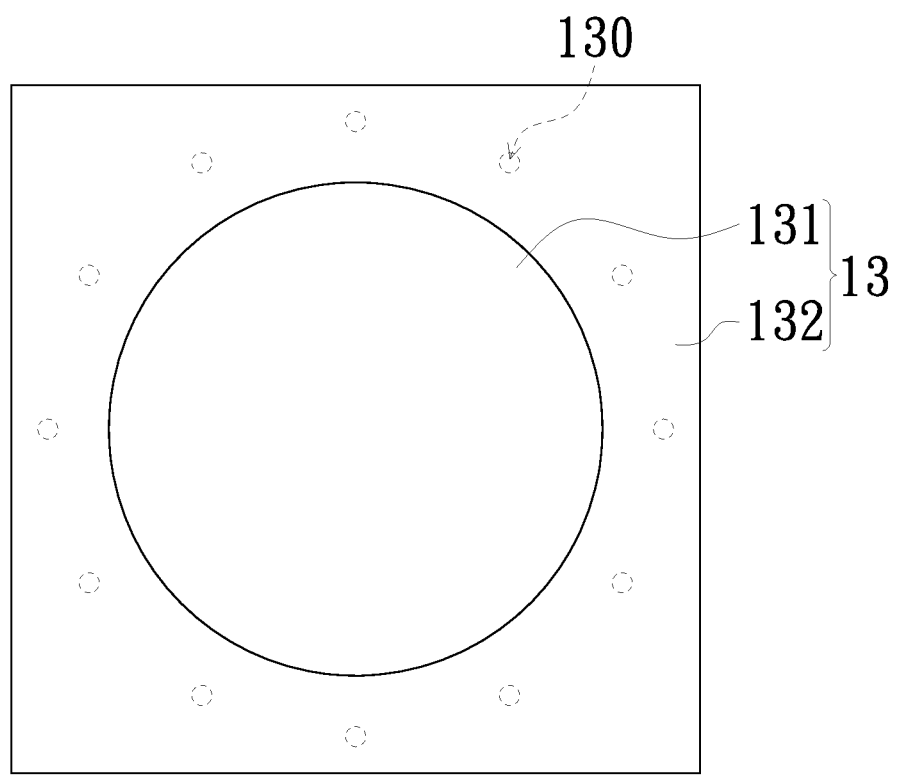
FIG. 3 is a schematic top view of a light transmission unit shown in FIG. 1.

Referring to FIGS. 1-3, in which FIG. 1 is a schematic cross-sectional diagram of a light emitting package base structure, FIG. 2 is a schematic top view of a carrier 11 and a dam 14 shown in FIG. 1, and FIG. 3 is a schematic top view of a light transmission unit 13 shown in FIG. 1. As shown in FIGS. 1-3, the light emitting package base structure 1 comprises a carrier 11, a light emitting chip 12, a light transmission unit 13 and a dam 14. The carrier 11 comprises a supporting surface 113 and an outer surface 114 surrounding the supporting surface 113. The light emitting chip 12 is disposed above the supporting surface 113 of the carrier 11, and the light emitting chip 12 is electrically-connected to the carrier 11. In the present embodiment, the light emitting chip 12 can be, for example, a short wavelength ultraviolet-light light emitting diode of a wavelength about 410 nm, but the present disclosure is not limited thereto. The light transmission unit 13 is disposed on the carrier 11, and the light transmission unit 13 comprises at least one through hole 130. The dam 14 is disposed between the carrier 11 and the light transmission unit 13 to surround the light emitting chip 12. In the present embodiment, a hermetic receiving space 100 is formed between the dam 14, the light transmission unit 13 and the carrier 11. The light emitting chip 12 is located in the hermetic receiving space 100, and the dam 14 comprises a side surface 141 away from the hermetic receiving space 100. A gap G is formed between the side surface 141 of the dam 14 and the outer surface 114 of the carrier 11. The through hole 130 of the light transmission unit 13 is located between the side surface 141 of the dam 14 and the outer surface 114 of the carrier 11.

The followings are descriptions of detail components in the light emitting package base structure of the present disclosure.

As shown in FIGS. 1 and 2, the carrier 11 of the present disclosure comprises a substrate 111 and a supporting dam 112. The substrate 111 comprises the support surface 113, so that the light emitting chip 12 is disposed above or on the substrate 111. The supporting dam 112 is disposed on the supporting surface 113 of the substrate 111 to surround the light emitting chip 12. The supporting dam 112 comprises the outer surface 114 described above and a connection surface 115 abutting the outer surface 114. The connection surface 115 faces the light transmission unit 13, and the dam 14 is disposed between the connection surface 115 of the supporting dam 112 and the light transmission unit 13. More specifically, the supporting dam 112 further comprises an inner surface 116 opposite to the outer surface 114 thereof, and the connection surface 115 is adjacent to the outer surface 114 and the inner surface 116 thereof. The dam 14 further comprises a side surface 142 opposite to the side surface 141, and the side surface 142 is adjacent to the hermetic receiving space 100. In the present disclosure, the dam 14 is connected with the connection surface 115 of the dam 112, and the side dam 142 of the dam 14 and the inner surface 116 of the supporting dam 112 are, for example, coplanar, but the location of the dam 14 of the present disclosure is not limited thereto. The dam 14 can be disposed at any place on the connection surface 115, since the gap G is formed between the side surface 141 of the dam 14 and the outer surface 114 of the supporting dam 112.

The substrate 111 of the present disclosure may comprise materials such as aluminum nitride or aluminum oxide, but the present disclosure is not limited thereto. The supporting dam 112 of the present disclosure may comprise reflective materials capable of reflecting light, such as aluminum nitride or aluminum oxide that is the same as materials of the substrate 111, but the present disclosure is not limited thereto. It is noted that in the present disclosure, the carrier 11 is composed of, for example, the substrate 111 and the supporting dam 112, but the present disclosure is not limited thereto. In other embodiment, the carrier 11 is, for example, integrally-formed. It is noted that, in the present embodiment, the carrier 11 and the dam 14 can be, for example, two different or distinct components connecting with each other, but the present disclosure is not limited thereto. In other embodiment, the carrier 11 and the dam 14 are, for example, integrally-formed, so that the carrier 11 and the dam 14 comprise the same aluminum nitride or aluminum oxide, but materials for forming the dam 14 of the present disclosure are not limited thereto.

As shown in FIG. 1 and FIG. 3, the light transmission unit 13 of the present disclosure comprises a lens portion 131 and a plane portion 132, which are connected with each other. The lens portion 131 is corresponding to the light emitting chip 12. In the present disclosure, the lens portion 131 comprises a convex lens, but the present disclosure is not limited thereto. In other disclosure or embodiment, the lens portion 131 comprises a concave lens, and in yet other embodiment, the lens portion 131 comprises a plate lens. The plane portion 132 surrounds the lens portion 131, and the dam 14 is located between the carrier 11 and the plane portion 132. More specifically, the dam 14 is located between the connection surface 115 of the supporting dam 112 and the plane portion 132 of the light transmission unit 13, and the dam 14 abuts the plane portion 132, thereby forming a recess O between the plane portion 132, the side surface 142 of the dam 14, and the connection surface 115 of the supporting dam 112. This recess O and the through hole 130 of the light transmission unit 13 are connected with each other. In addition, the number of the through holes 130 of the light transmission unit 13 are multiple (or more than one), and there are twelve through holes 130 provided as an example in the present embodiment, but the number of the through hole 130 of the present disclosure is not limited thereto. The number of the through holes 130 can be increased or decreased depending on the practical needs. A distance between two adjacent through holes 130 of these through holes 130 can be equal or unequal, and the through holes 130 are disposed in an orderly manner surrounding the lens portion 131.

As shown in FIG. 1, the light emitting package base structure 1 further comprises an adhesive 15. The adhesive 15 is disposed between the carrier 11, the light transmission unit 13, and the dam 14. More specifically, the adhesive 15 is located between the connection surface 115 of the supporting dam 112, the plane portion 132 of the light transmission unit 13, and the side surface 141 of the dam 14. The light transmission unit 13 is bonded to the carrier 11 through the adhesive 15, so that the plane portion 132 of the light transmission unit 13 is bonded to the connection surface 115 of the supporting dam 112.

As shown in FIG. 1, the carrier 11 of the present embodiment further comprises a first conductive pad 16 and a second conductive pad 17, and the light emitting chip 12 comprises a first electrical connection terminal 121 and a second electrical connection terminal 122. In the present embodiment, the first electrical connection terminal 121 and the second electrical connection terminal 122 of the light emitting chip 12 are opposite to each other, and an electrode (not shown) is disposed on the first electrical connection terminal 121 to electrically connect with the first conductive pad 16 of the carrier 11, and an electrode (not shown) is disposed on the second electrical connection terminal 122 to electrically connect with the second conductive pad 17. More specifically, the second electrical connection terminal 122 is electrically connected with the second conductive pad 17 through, for example, a conductive wire 18. It is noted that the above electrical connection between the light emitting chip 12 and the carrier 11 is one of the embodiments of the present disclosure, but the present disclosure is not limited thereto.

Figure 4A:
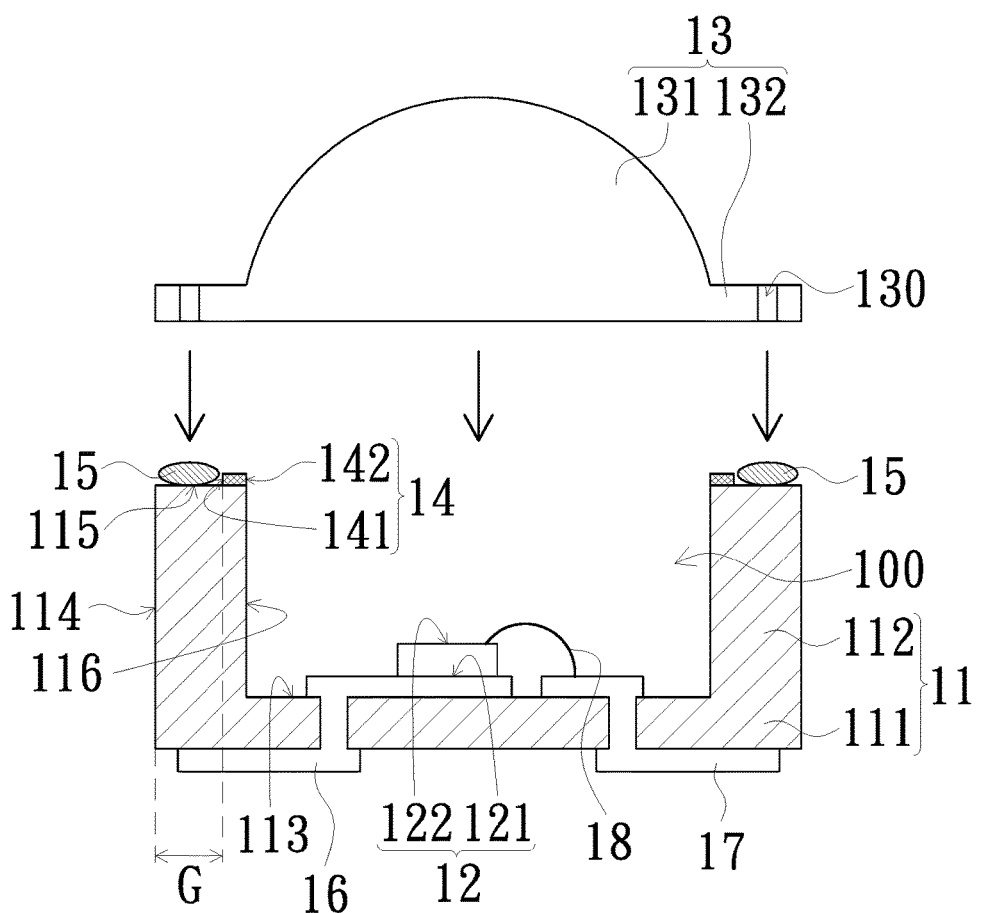
FIG. 4A is a schematic diagram showing how to assemble a light transmission unit and a carrier in accordance with an embodiment of the present invention.
Figure 4B:
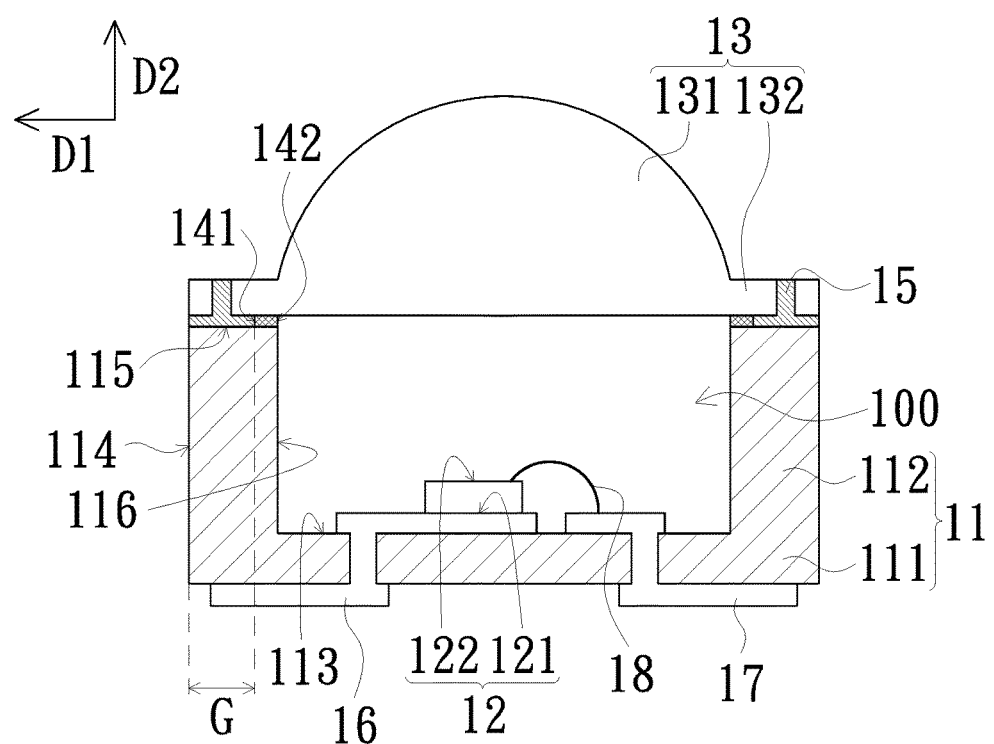
FIG. 4B is a schematic diagram showing an assembly of the transmission unit and the carrier shown in FIG. 4A.

Referring to FIGS. 4A and 4B, FIG. 4A is a schematic diagram showing how to assemble the light transmission unit 13 and the carrier 11 of the present embodiment, and FIG. 4B is a schematic diagram showing an assembly of the light transmission unit 13 and the carrier 11 shown in FIG. 4A. As shown in FIG. 4A, the plane portion 132 of the light transmission unit 13 is bonded to the connection surface 115 of the supporting dam 112 of the carrier 11 through the adhesive 15 in a vacuum environment. As shown in FIG. 4B, after the light transmission unit 13 is bonded to the carrier 11, the light transmission unit 13 covers the light emitting chip 12, and the lens portion 131 of the light transmission unit 13 is corresponding to the light emitting chip 12, thereby forming the hermetic receiving space 100 between the carrier 11 and the light transmission unit 13, and the dam 14 is disposed between the connection surface 115 of the supporting dam 112 and the plane portion 132 of the light transmission unit 13, and the dam 14 abuts the plane portion 132 of the light transmission unit 13. At this time, the adhesive 15 is deformed due to squeezing of the light transmission unit 13 and the carrier 11, so that the adhesive 15 extends respectively towards a first direction D1 and a second direction D2. That is, the adhesive 15 respectively extends into the through holes 130 of the light transmission unit 13 and the recess O (formed by surrounding by the side surface 141 of the dam 14, the plane portion 132 of the light transmission unit 13, and the connection surface 115 of the supporting dam 112). Next, the adhesive 15 is heated to cure thereof, and the volume of the adhesive 15 is gradually shrunken due to thermal volatilization of the adhesive 15. As shown in FIG. 1, the thermally cured adhesive 15 is located between the connection surface 115 of the supporting dam 112, the plane portion 132 of the light transmission unit 13, and the side surface 141 of the dam 14, so that the adhesive 15 will not be left behind in the through holes 130 of the light transmission unit 13. In addition, the volatile gases caused by thermally curing the adhesive 15 will be exhausted through the through holes 130 of the light transmission unit 13 and the opening of the recess O, so that the volatile gasses will not flow into the hermetic receiving space 100, so that the hermetic receiving space 100 is maintained at vacuum.

As described above, the light transmission unit is provided with through holes and a dam is disposed between the light transmission unit and the carrier in the light emitting package base structure of the present disclosure. In such a structural design, volatile gases caused by thermal curing of the adhesive during fabrication of the light emitting package base structure will be blocked by the dam and will not flow into the hermetic receiving space, and the volatilized gases will be exhausted by the through holes of the light transmission unit to ensure that the hermetic receiving space remain at vacuum. Accordingly, the problems of volatile gases flowing in to hermetic receiving space found in conventional light emitting diode package base structure can be effectively solved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A light emitting package base structure, comprising:
    a carrier having a supporting surface and an outer surface surrounding the supporting surface;
    a light emitting chip disposed on the supporting surface and electrically connected to the carrier;
    a light transmission unit disposed on the carrier, wherein the light transmission unit comprises a lens portion and a plane portion connected with each other, and the plane portion has at least one through hole;
    a dam disposed between the carrier and the light transmission unit, surrounding the light emitting chip, wherein the dam abuts against the plane portion and the carrier, and a hermetic receiving space is formed between the dam, the light transmission unit and the carrier, and the light emitting chip is located in the hermetic receiving space, wherein the hermetic receiving space is at vacuum, and the dam has a side surface away from the hermetic receiving space, and a gap is formed between the side surface and the outer surface thereby forming a recess between the plane portion, the side surface and the carrier, and the at least one through hole of the plane portion of the light transmission unit is correspond to a location between the side surface and the outer surface to connect with the recess; and
    an adhesive disposed in the recess, and the light transmission unit adhered to the carrier through the adhesive.

2. The light emitting package base structure according to claim 1, wherein the carrier comprises:
    a substrate comprising the supporting surface; and
    a supporting dam disposed at the supporting surface of the substrate, surrounding the light emitting chip, wherein the supporting dam comprises the outer surface and a connection surface abutting the outer surface, and the connection surface faces the light transmission unit, and the dam abuts against the connection surface and the plane portion of the light transmission unit.

3. The light emitting package base structure according to claim 2, wherein the substrate comprises aluminum nitride or aluminum oxide.

4. The light emitting package base structure according to claim 2, wherein the supporting dam comprises reflective materials.

5. The light emitting package base structure according to claim 1, wherein the carrier is integrally formed.

6. The light emitting package base structure according to claim 1, wherein the lens portion is corresponding to the light emitting chip, and the plane portion surrounds the lens portion.

7. The light emitting package base structure according to claim 6, wherein the light transmission unit comprises a plurality of through holes, and the plurality of through holes surrounds the lens portion.

8. The light emitting package base structure according to claim 6, wherein the lens portion comprises a convex lens or a concave lens.

9. The light emitting package base structure according to claim 1, wherein the light emitting chip comprises a deep-ultraviolet light emitting diode.

\* \* \* \* \*